(12) United States Patent
Bistritzer et al.

(10) Patent No.: US 11,953,316 B2
(45) Date of Patent: Apr. 9, 2024

(54) GEOMETRY BASED THREE DIMENSIONAL RECONSTRUCTION OF A SEMICONDUCTOR SPECIMEN BY SOLVING AN OPTIMIZATION PROBLEM, USING AT LEAST TWO SEM IMAGES ACQUIRED AT DIFFERENT ILLUMINATION ANGLES

(71) Applicant: Applied Materials Israel Ltd., Rehovot (IL)

(72) Inventors: Rafael Bistritzer, Petach Tikva (IL); Anna Levant, Rehovot (IL); Moshe Eliasof, Givatayim (IL); Michael Chemama, Rehovot (IL); Konstantin Chirko, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 425 days.

(21) Appl. No.: 17/024,578

(22) Filed: Sep. 17, 2020

(65) Prior Publication Data
US 2022/0082376 A1 Mar. 17, 2022

(51) Int. Cl.
*H01J 37/147* (2006.01)
*G01B 15/02* (2006.01)
*G01N 23/2251* (2018.01)

(52) U.S. Cl.
CPC ......... *G01B 15/02* (2013.01); *G01N 23/2251* (2013.01); *H01J 37/1478* (2013.01); *G01N 2223/401* (2013.01); *G01N 2223/6116* (2013.01); *G01N 2223/6462* (2013.01); *H01J 2237/1506* (2013.01)

(58) Field of Classification Search
None
See application file for complete search history.

(56) References Cited

U.S. PATENT DOCUMENTS

| | | | | |
|---|---|---|---|---|
| 4,943,722 A | * | 7/1990 | Breton | H01J 37/28 250/307 |
| 2011/0108736 A1 | * | 5/2011 | Preikszas | H01J 37/1478 250/397 |

OTHER PUBLICATIONS

Iwahori et al. "Obtaining shape from Scanning Electron Microscope using Hopfield neural network" 16 Journal of Intelligent Manufacturing 715-725 (2005) (Year: 2005).*

* cited by examiner

*Primary Examiner* — James Choi
(74) *Attorney, Agent, or Firm* — Lowenstein Sandler LLP (57) ABSTRACT

There is provided a system and a method comprising obtaining a first (respectively second) image of an area of the semiconductor specimen acquired by an electron beam examination tool at a first (respectively second) illumination angle, determining a plurality of height values informative of a height profile of the specimen in the area, the determination comprising solving an optimization problem which comprises a plurality of functions, each function being representative of a difference between data informative of a grey level intensity at a first location in the first image and data informative of a grey level intensity at a second location in the second image, wherein, for each function, the second location is determined with respect to the first location, or conversely, when solving the optimization problem, wherein a distance between the first and the second locations depends on the height profile, and the first and second illumination angles.

20 Claims, 6 Drawing Sheets

GEOMETRY BASED THREE DIMENSIONAL RECONSTRUCTION OF A SEMICONDUCTOR SPECIMEN BY SOLVING AN OPTIMIZATION PROBLEM, USING AT LEAST TWO SEM IMAGES ACQUIRED AT DIFFERENT ILLUMINATION ANGLES

TECHNICAL FIELD

The presently disclosed subject matter relates, in general, to the field of examination of a specimen, and more specifically, to automating the examination of a specimen.

BACKGROUND

Current demands for high density and performance associated with ultra large-scale integration of fabricated devices require submicron features, increased transistor and circuit speeds, and improved reliability. Such demands require formation of device features with high precision and uniformity, which, in turn, necessitates careful monitoring of the fabrication process, including automated examination of the devices while they are still in the form of semiconductor wafers.

Examination processes are used at various steps during semiconductor fabrication to measure dimensions of the specimens, and/or to detect and classify defects on specimens (e.g. Automatic Defect Classification (ADC), Automatic Defect Review (ADR), etc.).

General Description

In accordance with certain aspects of the presently disclosed subject matter, there is provided a system of examination of a semiconductor specimen, the system comprising a processor and memory circuitry (PMC) configured to obtain a first image of an area of the semiconductor specimen acquired by an electron beam examination tool at a first illumination angle, a second image of the area acquired by the electron beam examination tool at a second illumination angle, different from the first illumination angle, determine a plurality of height values informative of a height profile of the semiconductor specimen in the area, wherein determination of the plurality of height values comprises determining height values which solve an optimization problem, wherein the optimization problem comprises a plurality of functions, each function being informative of at least a difference between data informative of a grey level intensity at a first location in the first image, and data informative of a grey level intensity at a second location in the second image, wherein, when solving the optimization problem, for each function, the second location is determined with respect to the first location located at a distance from the second location which depends on the height profile in the area, the first illumination angle and the second illumination angle, or the first location is determined with respect to the second location located at a distance from the first location which depends on the height profile in the area, the first illumination angle and the second illumination angle.

According to some embodiments, for a given function of the plurality of functions, the system is configured to determine a height value at a location in the area which depends on the first location or on the second location determined for this given function.

According to some embodiments, for a given function of the plurality of functions, the system is configured to determine a height value at a location which depends on the first location, said height value and the first illumination angle, or the second location, said height value and the second illumination angle.

According to some embodiments, the optimization problem comprises a constraint linking some or all of the plurality of height values in the area.

According to some embodiments, a plurality of height values is simultaneously determined as solutions of the optimization problem.

According to some embodiments, the system is configured to take into account a first estimation of the height profile to determine the plurality of height values.

According to some embodiments, the system is configured to determine a height value at a given location in the area which complies with an expected variation of the height profile of the specimen in a region including the given location.

According to some embodiments, the optimization problem comprises a corrective term which takes into account dependency of grey level intensity with respect to illumination angle.

According to some embodiments, the system is configured to perform a spatial alignment process of at least one of data informative of grey level intensity of the first image and data informative of grey level intensity of the second image.

According to some embodiments, for a given function of the plurality of functions, the first location and the second location are linked by a relationship which depends on the height value of the specimen at a location at which the height value is determined, the first illumination angle and the second illumination angle.

In accordance with certain aspects of the presently disclosed subject matter, there is provided a method of examination of a semiconductor specimen, the method comprising, by a processor and memory circuitry (PMC), obtaining a first image of an area of the semiconductor specimen acquired by an electron beam examination tool at a first illumination angle, a second image of the area acquired by the electron beam examination tool at a second illumination angle, different from the first illumination angle, determining a plurality of height values informative of a height profile of the semiconductor specimen in the area, wherein determination of the plurality of height values comprises determining height values which solve an optimization problem, wherein the optimization problem comprises a plurality of functions, each function being informative of at least a difference between data informative of a grey level intensity at a first location in the first image, and data informative of a grey level intensity at a second location in the second image, wherein, when solving the optimization problem, for each function, the second location is determined with respect to the first location located at a distance from the second location which depends on the height profile in the area, the first illumination angle and the second illumination angle, or the first location is determined with respect to the second location located at a distance from the first location which depends on the height profile in the area, the first illumination angle and the second illumination angle.

According to some embodiments, the method comprises, for a given function of the plurality of functions, determining a height value at a location which depends on the first location, said height value and the first illumination angle, or the second location, said height value and the second illumination angle.

According to some embodiments, the optimization problem comprises a constraint linking some or all of the plurality of height values in the area.

According to some embodiments, a plurality of height values is simultaneously determined as solutions of the optimization problem.

According to some embodiments, the method comprises using at least one of a priori knowledge of the specimen and two-dimensional critical dimension measurements of the specimen in the optimization problem (e.g. as a constraint) to determine the plurality of height values.

According to some embodiments, the method comprises determining a height value at a given location in the area which complies with an expected variation of the height profile of the specimen in a region including the given location.

According to some embodiments, the optimization problem comprises a corrective term which takes into account dependency of grey level intensity with respect to illumination angle.

According to some embodiments, the method comprises performing a spatial alignment process of at least one of data informative of grey level intensity of the first image and data informative of grey level intensity of the second image.

According to some embodiments, for a given function of the plurality of functions, the first location and the second location are linked by a relationship which depends on the height value of the specimen at a location at which the height value is determined, the first illumination angle and the second illumination angle In accordance with certain other of the presently disclosed subject matter, there is provided a non-transitory computer readable medium comprising instructions that, when executed by a processor, cause the processor to perform operations as described above.

Among advantages of certain embodiments of the presently disclosed subject matter is the ability to reconstruct the height profile of a specimen using a non-destructive method. According to some embodiments, the proposed solution improves precision for reconstructing the height profile of the specimen. According to some embodiments, the proposed solution enables full reconstruction of the height profile of a specimen. According to some embodiments, the proposed solution provides specific local information on the height profile, such as roughness of the specimen. According to some embodiments, the proposed solution does not require identifying topo-points. According to some embodiments, the proposed solution takes into account a constraint on the height profile, such as a constraint derived from a priori knowledge of the height profile.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "obtaining", "determining", "taking into account", "outputting", "performing", "solving" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the system 103 and respective parts thereof disclosed in the present application.

The terms "non-transitory memory" and "non-transitory storage medium" used herein should be expansively construed to cover any volatile or non-volatile computer memory suitable to the presently disclosed subject matter.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "examination" used in this specification should be expansively construed to cover any kind of metrology-related operations as well as operations related to detection and/or classification of defects in a specimen during its fabrication. Examination is provided by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof using the same or different inspection tools. Likewise, examination can be provided prior to manufacture of the specimen to be examined and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes, atomic force microscopes, optical inspection tools, etc.

The term "design data" used in the specification should be expansively construed to cover any data indicative of hierarchical physical design (layout) of a specimen. Design data can be provided by a respective designer and/or can be derived from the physical design (e.g. through complex simulation, simple geometric and Boolean operations, etc.). Design data can be provided in different formats such as, by way of non-limiting examples, GDSII format, OASIS format, etc. Design data can be presented in vector format, grayscale intensity image format, or otherwise.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Figure 1:
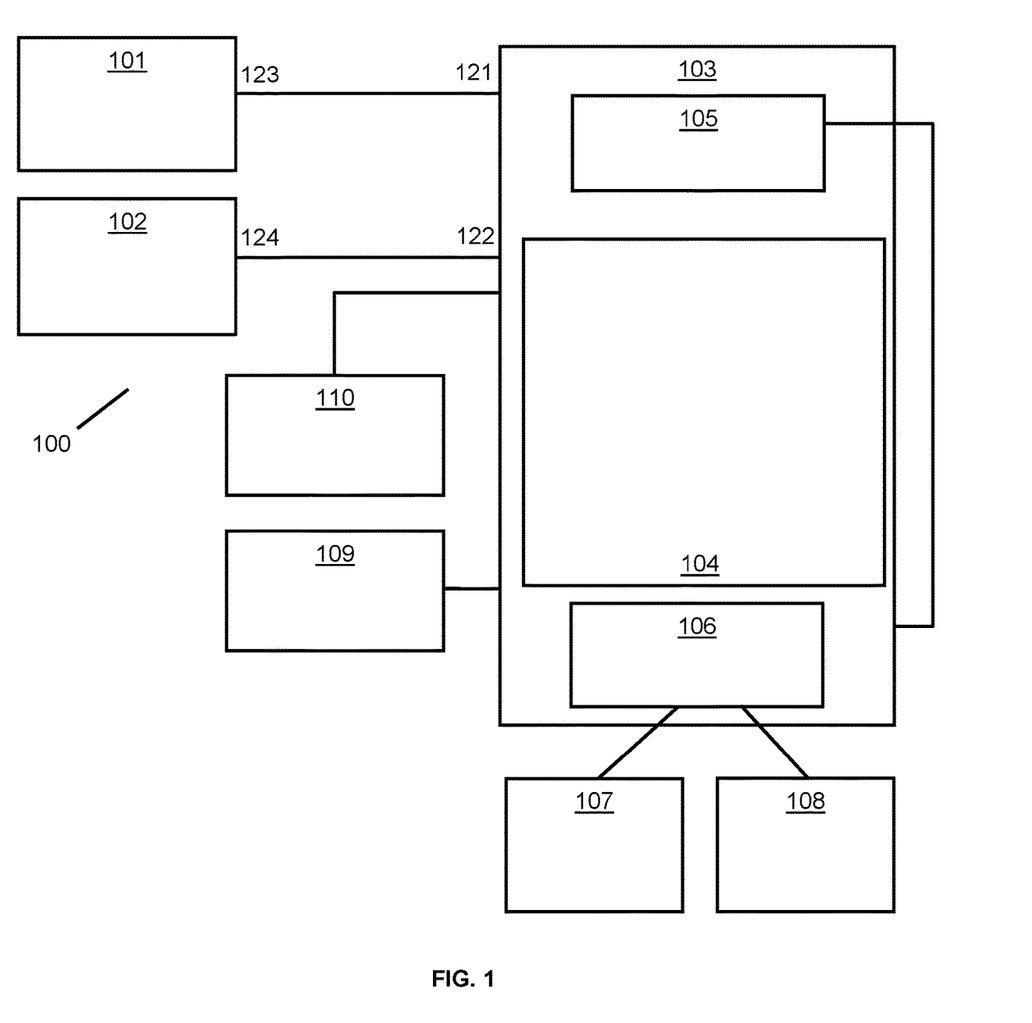
FIG. 1 illustrates a generalized block diagram of an examination system in accordance with certain embodiments of the presently disclosed subject matter.

Bearing this in mind, attention is drawn to FIG. 1 illustrating a functional block diagram of an examination system in accordance with certain embodiments of the presently disclosed subject matter. The examination system 100 illustrated in FIG. 1 can be used for examination of a specimen (e.g. of a wafer and/or parts thereof) as a part of the specimen fabrication process. The illustrated examination system 100 comprises computer-based system 103 capable of automatically determining metrology-related and/or defect-related information using images obtained during specimen fabrication. System 103 can be operatively connected to one or more low-resolution examination tools 101 and/or one or more high-resolution examination tools 102 and/or other examination tools. The examination tools are configured to capture images and/or to review the captured image(s) and/or to enable or provide measurements related to the captured image(s). System 103 can be further operatively connected to CAD server 110 and data repository 109.

System 103 includes a processor and memory circuitry (PMC) 104 operatively connected to a hardware-based input interface 105 and to a hardware-based output interface 106. PMC 104 is configured to provide all processing necessary for operating the system 103 as further detailed hereinafter (see methods described in FIGS. 2, 3 and 5, which can be performed at least partially by system 103) and includes a processor (not shown separately) and a memory (not shown separately). The processor of PMC 104 can be configured to execute several functions in accordance with computer-readable instructions implemented on a non-transitory computer-readable memory comprised in the PMC.

System 103 is configured to receive, via input interface 105, input data. Input data can include data (and/or derivatives thereof and/or metadata associated therewith) produced by the examination tools and/or data produced and/or stored in one or more data repositories 109 and/or in CAD server 110 and/or another relevant data depository. It is noted that input data can include images (e.g. captured images, images derived from the captured images, simulated images, synthetic images, etc.) and associated numeric data (e.g. metadata, hand-crafted attributes, etc.). It is further noted that image data can include data related to a layer of interest and/or to one or more other layers of the specimen.

System 103 is further configured to process at least part of the received input data and send, via output interface 106, the results (or part thereof) to a storage system 107, to examination tool(s), to a computer-based graphical user interface (GUI) 108 for rendering the results and/or to external systems (e.g. Yield Management System (YMS) of a FAB). GUI 108 can be further configured to enable user-specified inputs related to operating system 103.

By way of non-limiting example, a specimen can be examined by one or more low-resolution examination machines 101 (e.g. an optical inspection system, low-resolution SEM, etc.). The resulting data (referred to hereinafter as low-resolution image data 121), informative of low-resolution images of the specimen, can be transmitted—directly or via one or more intermediate systems—to system 103. Alternatively, or additionally, the specimen can be examined by a high-resolution machine 102 (e.g. a subset of potential defect locations selected for review can be reviewed by a scanning electron microscope (SEM) or Atomic Force Microscopy (AFM)). The resulting data, (referred to hereinafter as high-resolution image data 122), informative of high-resolution images of the specimen, can be transmitted—directly or via one or more intermediate systems—to system 103. According to some embodiments, and as explained hereinafter, high-resolution images of a specimen can be acquired by an AFM or a TEM (Transmission Electron Microscope) and can be used in a calibration process (e.g. as ground truth).

It is noted that image data can be received and processed together with metadata (e.g. pixel size, text description of defect type, parameters of image capturing process, etc.) associated therewith.

Upon processing the input data (e.g. low-resolution image data and/or high-resolution image data, optionally together with other data as, for example, design data, synthetic data, etc.), system 103 can send the results (e.g. instruction-related data 123 and/or 124) to any of the examination tool(s), store the results (e.g. defect attributes, defect classification, etc.) in storage system 107, render the results via GUI 108 and/or send to an external system (e.g. to YMS).

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

Without limiting the scope of the disclosure in any way, it should also be noted that the examination tools can be implemented as inspection machines of various types, such as optical imaging machines, electron beam inspection machines and so on. In some cases, the same examination tool can provide low-resolution image data and high-resolution image data. In some cases, at least one examination tool can have metrology capabilities.

It is noted that the examination system illustrated in FIG. 1 can be implemented in a distributed computing environment, in which the aforementioned functional modules shown in FIG. 1 can be distributed over several local and/or remote devices, and can be linked through a communication network. It is further noted that in other embodiments at least some examination tools 101 and/or 102, data repositories 109, storage system 107 and/or GUI 108 can be external to the examination system 100 and operate in data communication with system 103 via input interface 105 and output interface 106. System 103 can be implemented as stand-alone computer(s) to be used in conjunction with the examination tools. Alternatively, the respective functions of the system can, at least partly, be integrated with one or more examination tools.

Figure 2:
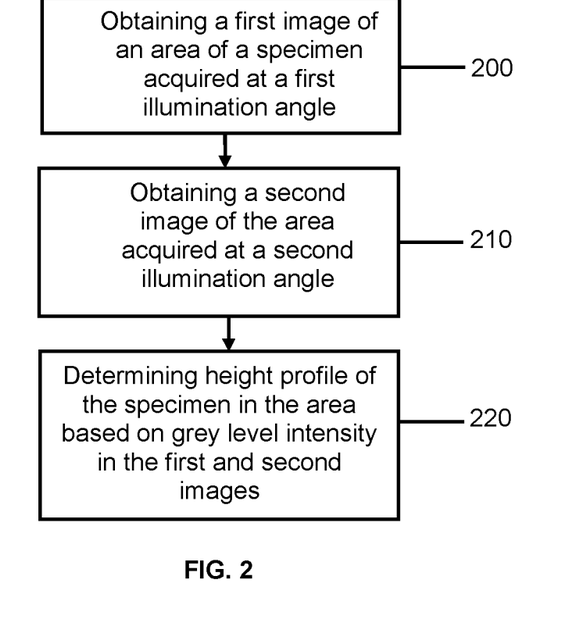
FIG. 2 illustrates a generalized flow-chart of a method of determining the height profile of a specimen.
Figure 2A:
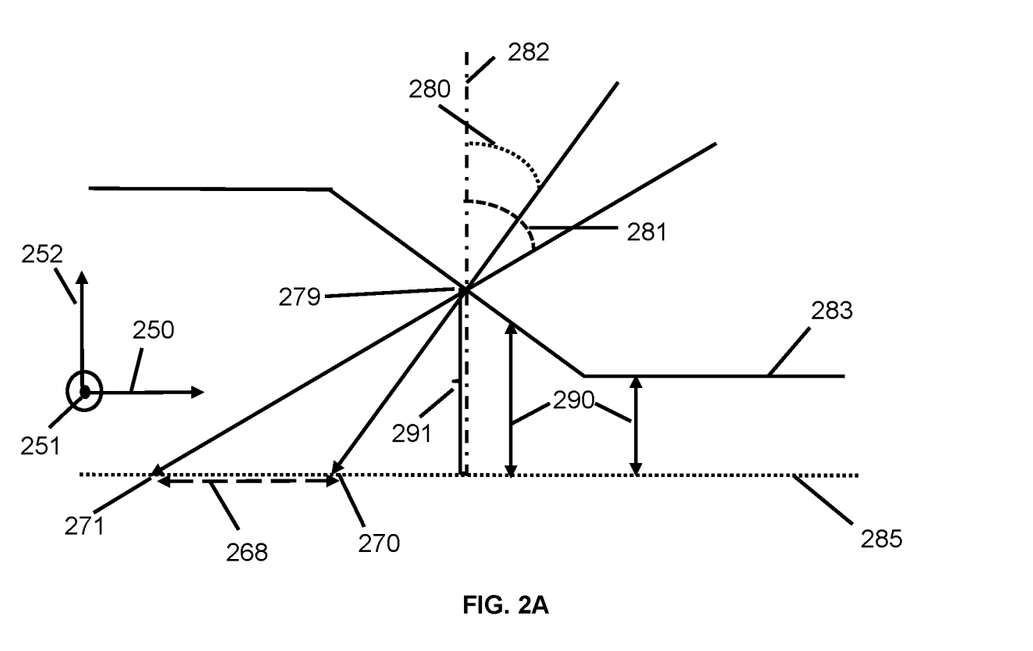
FIG. 2A illustrates a cross-sectional view of a specimen illustrative of an evolution of the height profile along an axis.

Attention is now drawn to FIGS. 2 and 2A, which describe a method of examination of a semiconductor specimen.

The method includes obtaining (operation 200) a first image of an area of the semiconductor specimen acquired by an electron beam examination tool at a first illumination angle 280 (see FIG. 2A). The electron beam examination tool can correspond in particular to a scanning electron microscope (SEM), as described with respect to reference 102 above.

The method includes obtaining (operation 210) a second image of the area of the semiconductor specimen acquired by the electron beam examination tool at a second illumination angle, which is different from the first illumination angle (e.g. the absolute value of the second illumination angle is different from the absolute value of the first illumination angle).

The first and second illumination angles 280, 281 are known, and can be selected using the electron beam examination tool, which comprises optical and electronic elements enabling selection of the illumination angle. The illumination angle can be expressed e.g. as an angle between the incident electron beam and a vertical axis or vertical plane 282 (e.g. orthogonal to the specimen).

According to some embodiments, a plurality of images (more than two) of the area can be obtained. These images may have been acquired at various different illumination angles by the electron beam examination tool.

The method further includes determining (operation 220) a plurality of height values informative of a height profile 290 of the specimen 283 in the area, based on the pixel intensity (grey level intensity) of the first and second images (as mentioned above, in some embodiments, more than two images can be obtained and therefore more than two images can be used to determine the plurality of height values). The specimen generally includes various features or structures (e.g. contacts, transistors, gates, etc.) and it is desired to determine their height (also called thickness or depth) within the area of interest. FIG. 2A shows a cross sectional view of specimen in a X-Z plane (X axis corresponds to reference 250, Y axis corresponds to reference 251 and Z axis corresponds to reference 252). As shown in the non-limitative example of FIG. 2A, the height profile 290 of the specimen can vary along at least one axis (X axis 250). In some embodiments, the height profile can vary along more than one axis.

Figure 2B:
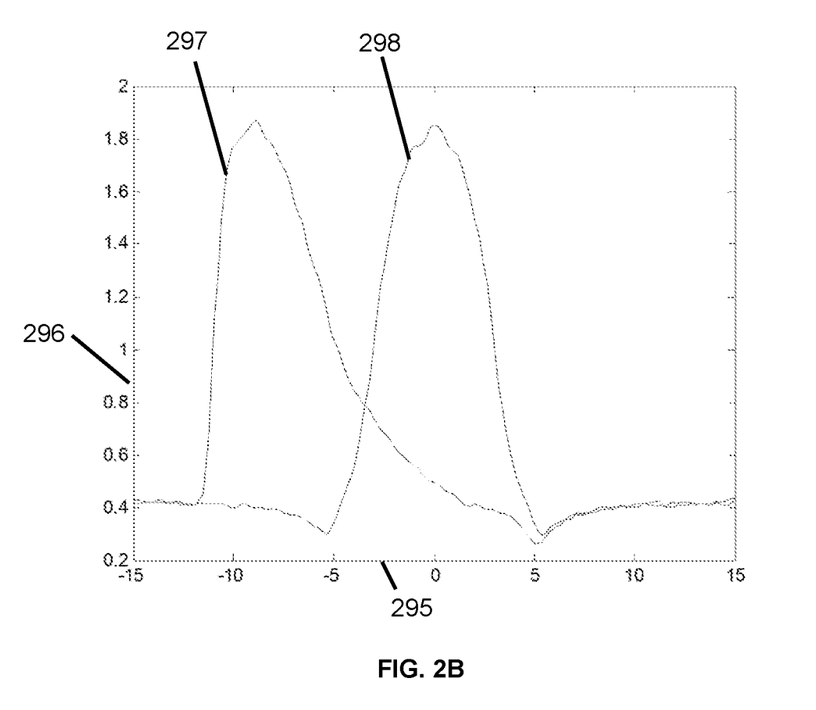
FIG. 2B illustrates examples of a grey level intensity of images acquired at different illumination angles.

Impingement of the beam (after its impact on the specimen) on a focal plane 285 (at which e.g. an imaging detector can be located) provides an image of the specimen. Each image (first and second images) generally includes at least a distribution of grey level intensity of the pixels. A non-limitative example is shown in FIG. 2B, in which grey level intensity (axis 296) is depicted with respect to the location 295 in the image (e.g. along an axis "X" depicted as 250 in FIG. 2A). The first image is associated with grey level intensity 297 and the second image is associated with grey level intensity 298. If the height profile is constant along the "Y" axis (reference 251), then the grey level intensity in each image can be e.g. averaged along the Y axis. This is however not mandatory.

Figure 3:
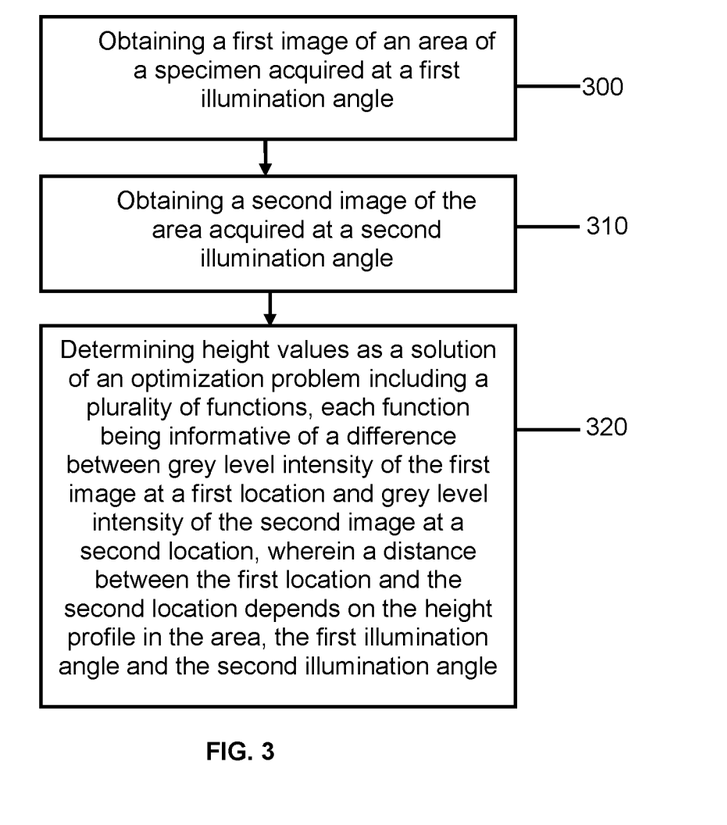
FIG. 3 illustrates a possible implementation of the method of FIG. 2.

FIG. 3 shows a possible implementation of the method of FIG. 2.

As explained above, it is attempted to determine a plurality of height values in order to reconstruct the height profile of the specimen in an area.

Determination of a height values can include determining (operation 320) height values which solve an optimization problem. In some embodiments, and as further explained hereinafter, the height values can be simultaneously determined as solutions of the optimization problem (which is common to all height values). In other embodiments, the height values can be determined independently (e.g. an optimization problem can be solved independently for each height value).

The optimization problem comprises a plurality of functions. The optimization problem is generally formulated as a minimization problem. Each function is informative of a difference between data informative of a grey level intensity at a first location in the first image (the first image has been obtained at operation 300), and data informative of a grey level intensity at a second location in the second image (the second image has been obtained at operation 310).

In particular, for each function of the optimization problem, a distance between the first location and the second location depends on the height profile 290 in the area, the first illumination angle 280 and the second illumination angle 281. Indeed, as further explained hereinafter, for a given point of the specimen which is impinged by the illumination beam, a first pixel is obtained for the first illumination angle, and a second pixel is obtained for the second illumination angle. The distance between the first pixel and the second pixel depends on the height of the given point, the first illumination angle, and the second illumination angle. Based on the relationship between the location of the first pixel and the location of the second pixel, and an assumption on the grey level intensity (which can be assumed to be e.g. substantially constant for the first pixel and the second pixel corresponding to the same point of the specimen, or with a variation to be determined by a model and/or by calibration), it is possible to formulate each function of the optimization problem. In some embodiments, an as explained hereinafter, additional constraints and/or a priori knowledge can be used in the formulation of the optimization problem.

In some embodiments, one location is predetermined (e.g. the first location is provided as a known input of the optimization problem) and therefore the height value(s) (together with the second location, which is linked to the first location by the height value) are to be determined when solving the optimization problem.

In some embodiments, the optimization problem is solved repetitively to determine a plurality of height values.

In some embodiments, the optimization problem can be solved simultaneously for a plurality of height values. As explained hereinafter, solving the optimization problem for a plurality of height values enables to take into account a constraint linking the plurality of height values, such as a prior knowledge on the height profile.

The method enables to determine height values for a plurality of locations in the area. In some embodiments, a full height profile is obtained for the area. The height profile can be used e.g. for metrology purposes (e.g. to measure trend in the manufacturing process of one or more structural features). In some embodiments, since a full height profile is obtained, local information about the specimen, such as its roughness, can be obtained. In some embodiments, the height profile can be used to detect defects (e.g. abnormality or undesirable features formed on the specimen, or within the specimen).

For each given function of the plurality of functions, a height value is obtained as an output of the optimization problem, which is determined at a location in the area which depends on the first location or on the second location. Specific examples are provided hereinafter.

In some embodiments, once the plurality of height values has been determined, the minimal height value can be set a reference value (zero value) and all other height values can be expressed relative to this reference value.

Reverting to FIG. 2A, assume that a given portion 279 of the specimen 283 has been acquired at a first illumination angle 280, and, during another acquisition, at a second illumination angle 281 (different from the first illumination angle 280).

As shown in FIG. 2A, the given portion 279 is imaged by a first pixel located at a first location 270 in the first image.

As shown in FIG. 2A, the given portion 279 is imaged by a second pixel located at a second location 271 in the second image. The second location 271 is different from the first location 270.

The distance 268 between the first location 270 and the second location 271 depends on the height profile (in particular on the height value 291 of the given portion 279), the first illumination angle 280 and the second illumination angle 281.

It can be assumed that the grey level intensity of the first pixel located at the first location 270 is equal to the grey level intensity of the second pixel located at the second location 271. In other words, it can be assumed that the grey level intensity is independent from the illumination angle. This is however an approximation. In some embodiments, it is attempted to correct this approximation when solving the optimization problem using a model and/or a calibration process.

The grey level intensity in the first and second images, the first illumination angle and the second illumination angle, are known. Therefore, it is possible to determine, for each location in the area, the corresponding height, by solving an optimization problem in which the height value(s) is (are) the parameter to be optimized, and a constraint of the optimization problem includes minimizing function(s) each representative of a difference between grey level intensity between a first location in the first image and a second location in the second image (together with other constraints, if applicable). As mentioned above, for each function, one location (e.g. first location) is provided as an input of the optimization problem, and the other location (e.g. second location) is determined when solving the optimization problem.

A non-limitative example of the optimization problem is provided hereinafter.

Assume that:
the first image has been acquired at a first illumination angle α (corresponding to reference 280) and that the second image has been acquired at a second illumination angle β (corresponding to reference 281);
the given portion 279 has a height $h_{279}$;
the first position 270 in the first image is denoted $x_\alpha$;
the second position 271 in the second image is denoted $x_\beta$;
the grey level intensity in the first image is f(x) (x is the position along axis "X" 250);
the grey level intensity in the second image is g(x)
Using the notations above, it turns out that:

$$x_\alpha = x_\beta - h_{279}(\tan \alpha - \tan \beta)$$

As mentioned above, it can be assumed (at least in a first approximation) that $f(x_\alpha) \approx g(x_\beta)$. Therefore, the following optimization problem can be formulated (this formulation is not limitative and is provided as an example only):

$$h = \mathrm{argmin}\, |g(x) - f(x - h_x(\tan \alpha - \tan \beta))|^2 \qquad \text{Equation 1}$$

In this equation, $h_x$ is unknown and is to be determined for each value of x. "x" corresponds to a (known) second location in the second image and "x−$k_x$(tan α−tan β)" corresponds to the (unknown) first location in the first image, which is to be determined with respect to the second location. As shown, the distance between the first location and the second location depends on the first illumination angle α, the second illumination angle β and the height profile ($h_x$ which is to be determined). h is the output of the optimization problem.

For a given value of x provided as an input of the optimization problem, and as shown in Equation 1, it is attempted to minimize a function informative of a difference between data informative of a grey level intensity at a first location in the first image ("f(x−$h_x$(tan α−tan β)") and data informative of a grey level intensity at a second location in the second image ("g(x)").

The optimization problem can therefore be solved for each value of x (e.g. for each known location in the second image).

In some embodiments, g(x) (respectively f(x)) can be determined as a continuous function based on an interpolation between pixel intensity in the second image (respectively in the first image). As a consequence, x (second location) does not necessarily correspond to a location of a "real" pixel in the second image, but can correspond to an interpolated location between real pixels in the second image. The same applies to the determined first location "x−$h_x$(tan α−tan β)".

The height value h which is determined as a solution of the optimization problem is located at a location which depends on the second location, the height value h itself, and the second illumination angle β.

In particular, in the optimization problem as formulated above, the height value determined for a value x corresponds to the height of the specimen at a location x+h tan β.

For example, for x=$x_\beta$, the height value h which is obtained corresponds to the height value at location $x_\beta$+h tan β. This is an estimation of the height value of the given portion 279.

By solving the optimization problem, it is possible to determine the height profile of the specimen for a plurality of locations in the area, and, in some embodiments, a full height profile is obtained for the area.

The optimization problem as formulated in Equation 1 takes the second location in the second image as an input and determines height value (and the first location) in the first image. This is not limitative, and the optimization problem can be formulated the other way round (the first location is the input, and the height value together with the second location are determined).

According to some embodiments, the optimization problem can be modified in order to take into account various constraints or corrections.

According to some embodiments, determination of the height profile takes into account a first estimation of the height profile. The first estimation can be based e.g. on design data which have been used to manufacture the specimen. The design data can therefore be used to provide a first estimation of the height profile. The first estimation of the height profile can be used as a starting point for determining the height value, which is then improved when trying to solve the optimization problem.

According to some embodiments, the optimization problem includes a constraint C (h) linking some or all of the plurality of height values in the area. A non-limitative example of the modified optimization problem is provided hereinafter:

$$h = \mathrm{argmin}\, \Sigma_i |g(x_i) - f(x_i - h_{x_i}(\tan \alpha - \tan \beta))|^2 + C(h) \qquad \text{Equation 2}$$

As shown in Equation 2, the optimization problem is a minimization problem which comprises (in addition to constraint C(h)) a plurality of functions. Similarly to Equation 1, each function is informative of a difference between data informative of a grey level intensity at a second location ("$g(x_i)$") and data informative of a grey level intensity at a first location ("$f(x_i-h_{x_i}(\tan\alpha-\tan\beta)$"). In this example, for each function, the second location $x_i$ is known, and the corresponding height $h_{x_i}$ (together with the first location ("$x_i-h_{x_i}(\tan\alpha-\tan\beta)$") is determined when solving the optimization problem.

An example of constraint C(h) can include an expected variation of the height profile (e.g. a constraint on the derivative of the height profile). If a height value is to be determined at some location, then determination of the height value is constrained by an expected variation of the height profile in a region including this location. This example is not limitative and other constraints can be taken into account. According to some embodiments, one or more constraints can be formulated in the optimization problem based e.g. on a priori knowledge of the specimen (e.g. provided by the manufacturer of the specimen) and/or based on measurements performed on the specimen (e.g. two-dimensional CD measurements).

Figure 4:
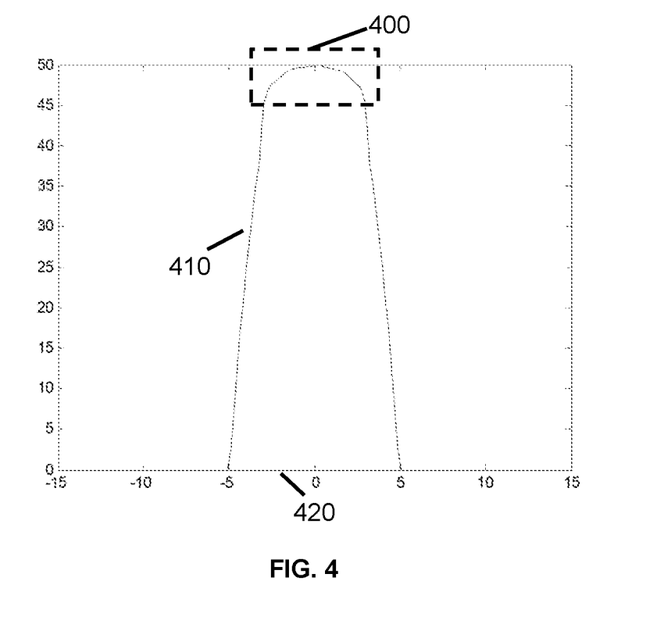
FIG. 4 illustrates an example of a first estimation of the height profile of the specimen.

Since determination of the height value relies on a minimization of a difference between pixel intensity in the first image and in the second image (as explained above), this determination may be more difficult in regions of the specimen in which the height profile tends to be "flat" (see e.g. region 400 in FIG. 4, which depicts a first estimation of the height profile 410 along an axis "X" 420). Indeed, the corresponding pixel intensity in the first and second images tends also to have a "flat" profile. In some embodiments, use of term C(x) which provides a constraint on the derivative of the height profile facilitates solving of the optimization problem, even in these "flat" regions of the height profile.

According to some embodiments, C(x) provides a constraint linking some or all of the plurality of height values in the area (for example in Equation 2, a constraint is imposed on the derivative of the height profile and therefore this links together the height values to be determined). Since the height values are interrelated by this constraint, the optimization problem needs to be solved simultaneously for a plurality of height values at a plurality of different locations. In other words, the output of the optimization problem includes as a solution a plurality of different interrelated height values obtained for different locations in the area. This differs form Equation 1, in which it is possible to determine each height value as a solution of an independent optimization problem.

It has been mentioned above that formulation of the optimization problem can rely on an assumption that the grey level intensity of a given point of the specimen is independent of the illumination angle. According to some embodiments, this assumption can be relaxed when solving the optimization problem. In some embodiments, a corrective term G(x) is introduced in the optimization problem in order to take into account a possible variation of the grey level intensity based on the illumination angle.

A modified optimization problem is provided hereinafter. Equation 3 is not limitative (in this equation, $G_{\alpha\backslash\beta}(x)$ correspond to the corrective term). In addition, in some embodiments, Equation 3 can also include a constraint C(h) on the plurality of height values, as mentioned above in Equation 2.

$$h=\arg\min|g(x)-G_{\alpha\backslash\beta}(x)f(x-h_x(\tan\alpha-\tan\beta))|^2 \quad \text{Equation 3}$$

The corrective term G(x) can be determined in some embodiments, based on concrete data extracted from a specimen (similar to the specimen to be examined). For example, the method as described above can be performed on a specimen. Then, the specimen can be cut and examined using an Atomic Force Microscope to determine the true height profile. A difference between the height profile determined by solving the optimization problem and the true height profile provides the corrective term G(x).

In some embodiments, the corrective term G(x) can be determined based on a model of the specimen.

In some embodiments, the corrective term G(x) can be set as a parameter to be solved in the optimization problem.

In some embodiments, it is possible to acquire a set of a plurality of images of a given area of the specimen at various different illumination angles ($\alpha_1, \ldots, \alpha_N$). The optimization problem can be formulated as explained in the various embodiments above, for a plurality of pairs of images of this set (in each pair, the images have been acquired at different illumination angles $\alpha_i$ and $\alpha_j$, with $i\neq j$).

In some embodiments, a plurality of areas of the specimen are acquired at a first illumination angle by the electron beam examination tool scanning the specimen, and then the plurality of areas of the specimen are acquired at a second illumination angle by the electron beam examination tool scanning the specimen. For a given area of the specimen, a spatial offset can be introduced between the first acquisition and the second acquisition (due e.g. to relative errors in positioning of the electron beam examination tool between the first and second acquisitions).

In light of the foregoing, according to some embodiments, a spatial alignment process can be performed on data informative of grey level intensity of the first image and/or on data informative of grey level intensity of the second image.

According to some embodiments, the spatial alignment process can rely on a first estimation of the height profile and on an image of the area acquired with an illumination angle equal to zero.

Figure 5:
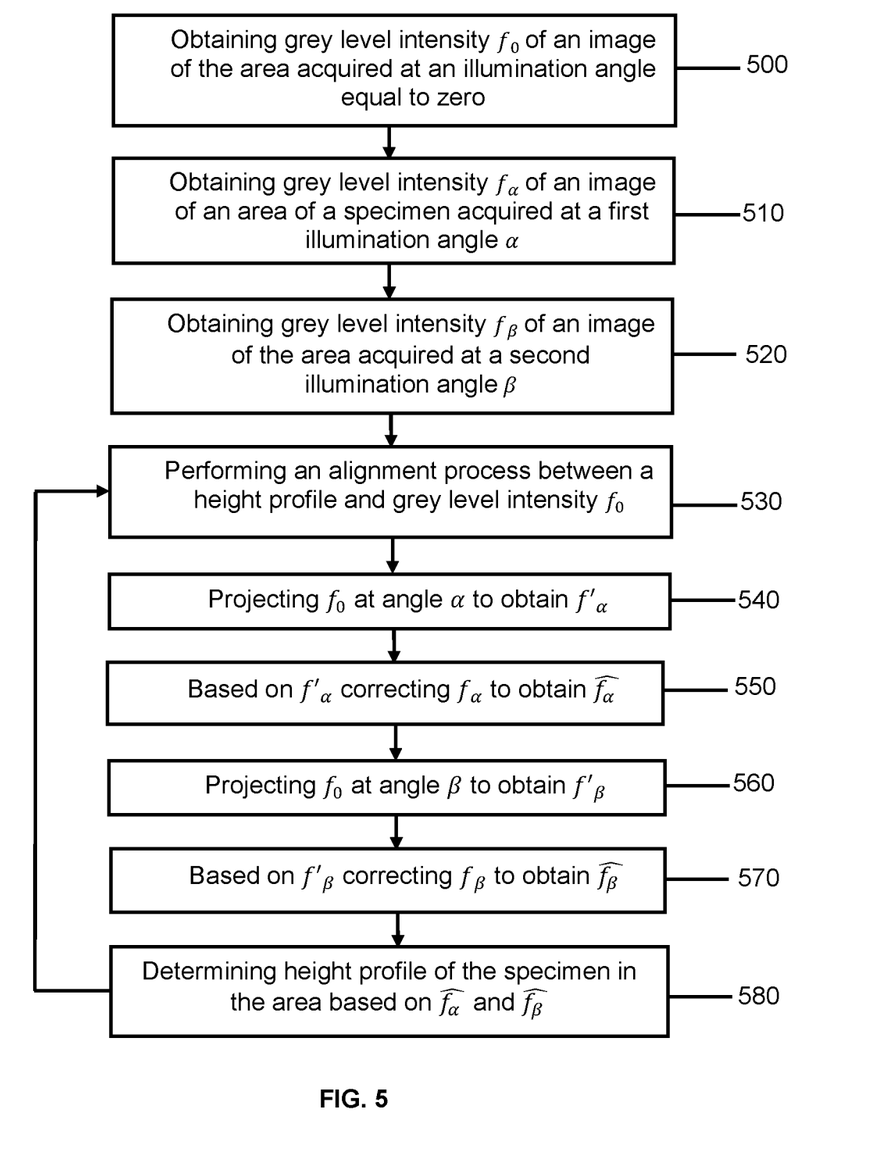
FIG. 5 illustrates a generalized flow-chart of a method of performing spatial alignment of the grey level intensity of the acquired images.

A non-limitative example of a spatial alignment process is provided in FIG. 5.

Assume (see operations 500, 510 and 520) that a first estimation $h_0$ of the height profile in an area of the specimen is obtained and assume that an image of the area is acquired by the electron beam examination tool at an illumination angle equal to zero. The corresponding grey level intensity is noted $f_0$. Assume that an image of the area is acquired by the electron beam examination tool at an illumination angle $\alpha$ (the corresponding grey level intensity is noted $f_\alpha$) and assume that an image of the area is acquired by the electron beam examination tool at an illumination angle $\beta$, different from $\alpha$ (the corresponding grey level intensity is noted $f_\beta$).

The method can include performing (operation 530) a spatial alignment between $f_0$ and a height profile of the specimen (in a first iteration of the method, this corresponds to $h_0$). In some embodiments, this can include (assuming that $f_0$ and $h_0$ are each symmetric) aligning the axis of symmetry of $f_0$ and the axis of symmetry of $h_0$.

The method can further include correcting the spatial distribution of the grey level intensity $f_\alpha$. This can include projecting (operation 540) $f_0$ to an angle $\alpha$ (to obtain $f'_\alpha$) based on h (at a first iteration of the method, $h=h_0$). Indeed, it has been mentioned above that data informative of a grey level intensity in a first image of the area acquired at a first illumination angle is linked to data informative of a grey level intensity in a second image of the area acquired at a second illumination angle based on the height profile, the first illumination angle, and the second illumination angle.

In particular, the following (non-limitative) relationship can be used to project $f_0$ to an angle $\alpha$:

$$f_0(x) = f'_\alpha(x - h(\tan\alpha - \tan\beta))\quad\text{Equation 4}$$

A registration can be performed between $f'_\alpha$ and $f_\alpha$ which therefore provides an offset $\Delta_\alpha$ between the two images. $f_\alpha$ is then corrected (to obtain $\widehat{f_\alpha}$) based on this offset $\Delta_\alpha$ (operation 550).

The same procedure can be applied to correct the spatial distribution of the grey level intensity $f_\beta$. This can include projecting (operation 560) $f_0$ to an angle $\beta$ (to obtain $f'_\beta$) based on h (at a first iteration of the method, $h=h_0$). In particular, the following (non-limitative) relationship can be used to project $f_0$ to an angle $\beta$:

$$f_0(x) = f'_\beta(x - h(\tan\alpha - \tan\beta))\quad\text{Equation 5}$$

A registration can be performed between $f'_\beta$ and $f_\beta$ which therefore provides an offset $\Delta_\beta$ between the two images. $f_\beta$ is then corrected (to obtain $\widehat{f_\beta}$) based on this offset $\Delta_\beta$ (operation 570).

A plurality of height values informative of the height profile of the specimen can then be determined (operation 580) based on $\widehat{f_\alpha}$ and $\widehat{f_\beta}$ using e.g. the method of FIG. 3.

In some embodiments, at operation 550, the method enables to determine a spatial offset between $f_\alpha$ and $f'_\alpha$ and also to determine a corrective term (referred to as $G_{\alpha\backslash\beta}(x)$ above) which takes into account dependency of grey level intensity with respect to illumination angle.

Since a new estimation h of the height profile is determined, the method can be, in some embodiments, repeated by reverting to operation 530 (and repeating operations 540 to 580), until e.g. a convergence criterion is met (for example which defines that the difference between the height profile obtained at two successive iterations is below a threshold).

The various embodiments described above can be performed for different slices of the specimen (along the "Y" axis—see reference 251 in FIG. 2A), thereby obtaining the height profile h(x) for different slices of the specimen along the "Y" axis.

It is to be understood that the invention is not limited in its application to the details set forth in the description contained herein or illustrated in the drawings.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

What is claimed is:

1. A system of examination of a semiconductor specimen, the system comprising a processor and memory circuitry (PMC) configured to:
obtain:
a first image of an area of a given semiconductor specimen acquired by an electron beam examination tool at a first illumination angle, wherein the first image is associated with a first grey level intensity profile, and
a second image of the area acquired by the electron beam examination tool at a second illumination angle, different from the first illumination angle, wherein the second image is associated with a second grey level intensity profile; and
use the first grey level intensity profile and the second grey level intensity profile to solve an optimization problem enabling determining a plurality of height values informative of a height profile of the given semiconductor specimen in the area,
wherein solving said optimization problem comprises:
determining at least one given height value of the plurality of height values such that, for a first location in the first image with a first grey level intensity, and a second location to be determined in the second image with a second grey level intensity and depending on said given height value, (1) and (2) are met:
(1) the second grey level intensity, or data informative thereof, matches the first grey level intensity, or data informative thereof, according to an optimization criterion, and
(2) a relationship between the second location and the first location complies with a model which models, for a given point of the specimen located at a given location in the first image, an expected position of this given point in the second image, as a function of at least the first illumination angle, the second illumination angle and the height profile of the specimen; and
wherein solving the optimization problem comprises using a corrective term in the optimization problem which takes into account dependency of grey level intensity with respect to illumination angle, wherein all images of the area of the given semiconductor specimen acquired by the electron beam examination tool and used in solving the optimization problem to determine a plurality of different height values informative of the height profile of the given semiconductor specimen have been acquired by the electron beam examination tool using a same given focal plane, said all images including the first image and the second image.

2. The system of claim 1, wherein the system is configured to determine the given height value at a location in the area which depends on the first location or on the second location determined for this given function.

3. The system of claim 1, wherein the system is configured to determine the given height value at a location which depends on:
the first location, said height value and the first illumination angle, or the second location, said height value and the second illumination angle.

4. The system of claim 1, wherein the optimization problem comprises a constraint linking some or all of the plurality of height values in the area.

5. The system of claim 1, wherein a plurality of height values is simultaneously determined as solutions of the optimization problem.

6. The system of claim 1, configured to take into account a first estimation of the height profile to determine the plurality of height values.

7. The system of claim 1, configured to determine a height value at a given location in the area which complies with an expected variation of the height profile of the specimen in a region including the given location.

8. The system of claim 1, wherein at least one of (i), (ii) or (iii) is met:
(i) the corrective term is determined using ground truth data of a specimen;
(ii) the corrective term is determined using a model of the specimen; or
(iii) the corrective term is determined in solving the optimization problem.

9. The system of claim 1, configured to perform a spatial alignment process of at least one of data informative of grey level intensity of the first image and data informative of grey level intensity of the second image.

10. The system of claim 1, wherein the first location and the second location are linked by a relationship which depends on the given height value of the specimen at a location at which the given height value is determined, the first illumination angle and the second illumination angle.

11. A method of examination of a semiconductor specimen, the method comprising, by a processor and memory circuitry (PMC):
obtaining:
a first image of an area of a given semiconductor specimen acquired by an electron beam examination tool at a first illumination angle, wherein the first image is associated with a first grey level intensity profile, and
a second image of the area acquired by the electron beam examination tool at a second illumination angle, different from the first illumination angle, wherein the second image is associated with a second grey level intensity profile; and
using the first grey level intensity profile and the second grey level intensity profile to solve an optimization problem enabling determining a plurality of height values informative of a height profile of the given semiconductor specimen in the area,
wherein solving said optimization problem comprises:
determining at least one given height value of the plurality of height values such that, for a first location in the first image with a first grey level intensity, and a second location to be determined in the second image with a second grey level intensity and depending on said given height value, (1) and (2) are met:
(1) the second grey level intensity, or data informative thereof, matches the first grey level intensity, or data informative thereof, according to an optimization criterion, and
(2) a relationship between the second location and the first location complies with a model which models, for a given point of the specimen located at a given location in the first image, an expected position of this given point in the second image, as a function of at least the first illumination angle, the second illumination angle and the height profile of the specimen; and
wherein solving the optimization problem comprises using a corrective term in the optimization problem which takes into account dependency of grey level intensity with respect to illumination angle, wherein all images of the area of the given semiconductor specimen acquired by the electron beam examination tool and used in solving the optimization problem to determine a plurality of different height values informative of the height profile of the given semiconductor specimen have been acquired by the electron beam examination tool using a same given focal plane, said all images including the first image and the second image.

12. The method of claim 11, comprising determining the given height value at a location which depends on:
the first location, said given height value and the first illumination angle, or the second location, said given height value and the second illumination angle.

13. The method of claim 11, wherein the optimization problem comprises a constraint linking some or all of the plurality of height values in the area.

14. The method of claim 11, wherein a plurality of height values is simultaneously determined as solutions of the optimization problem.

15. The method of claim 11, comprising using at least one of a priori knowledge of the specimen and two-dimensional critical dimension measurements of the specimen in the optimization problem to determine the plurality of height values.

16. The method of claim 11, comprising determining a height value at a given location in the area which complies with an expected variation of the height profile of the specimen in a region including the given location.

17. The method of claim 11, wherein at least one of (i), (ii) or (iii) is met:
(i) the corrective term is determined using ground truth data of a specimen;
(ii) the corrective term is determined using a model of the specimen; or
(iii) the corrective term is determined in solving the optimization problem.

18. The method of claim 11, comprising performing a spatial alignment process of at least one of data informative of grey level intensity of the first image and data informative of grey level intensity of the second image.

19. The method of claim 11, wherein the first location and the second location are linked by a relationship which depends on the given height value of the specimen at a location at which the given height value is determined, the first illumination angle and the second illumination angle.

20. A non-transitory computer readable medium comprising instructions that, when executed by a processor, cause the processor to perform operations comprising:
obtaining:
a first image of an area of a given semiconductor specimen acquired by an electron beam examination tool at a first illumination angle, wherein the first image is associated with a first grey level intensity profile, and
a second image of the area acquired by the electron beam examination tool at a second illumination angle, different from the first illumination angle, wherein the second image is associated with a second grey level intensity profile; and
using the first grey level intensity profile and the second grey level intensity profile to solve an optimization problem enabling determining a plurality of height values informative of a height profile of the given semiconductor specimen in the area, wherein solving said optimization problem comprises:
    determining at least one given height value of the plurality of height values such that, for a first location in the first image with a first grey level intensity, and a second location to be determined in the second image with a second grey level intensity and depending on said given height value, (1) and (2) are met:
        (1) the second grey level intensity, or data informative thereof, matches the first grey level intensity, or data informative thereof, according to an optimization criterion, and
        (2) a relationship between the second location and the first location complies with a model which models, for a given point of the specimen located at a given location in the first image, an expected position of this given point in the second image, as a function of at least the first illumination angle, the second illumination angle and the height profile of the specimen; and
    wherein solving the optimization problem comprises using a corrective term which takes into account dependency of grey level intensity with respect to illumination angle, wherein all images of the area of the given semiconductor specimen acquired by the electron beam examination tool and used in solving the optimization problem to determine a plurality of different height values informative of the height profile of the given semiconductor specimen have been acquired by the electron beam examination tool using a same given focal plane, said all images including the first image and the second image.

* * * * *